US005740105A

United States Patent [19]
Gill

[11] Patent Number: 5,740,105
[45] Date of Patent: Apr. 14, 1998

[54] MEMORY CELL ARRAY WITH LOCOS FREE ISOLATION

[75] Inventor: Manzur Gill, Arcola, Tex.

[73] Assignee: Texas Instruments Incorporated, Dallas, Tex.

[21] Appl. No.: 731,649

[22] Filed: Oct. 17, 1996

Related U.S. Application Data

[63] Continuation of Ser. No. 364,528, Dec. 23, 1994, abandoned, which is a continuation of Ser. No. 68,473, May 27, 1994, abandoned.

[51] Int. Cl.$^6$ .................................................. G11C 11/34
[52] U.S. Cl. .................. 365/185.05; 365/51; 365/63; 365/185.01; 257/315; 257/321
[58] Field of Search ............ 365/185.01, 185.05, 365/63, 51; 257/315, 321

[56] References Cited

U.S. PATENT DOCUMENTS

| | | | |
|---|---|---|---|
| 5,089,866 | 2/1992 | Iwasa | 365/185.01 X |
| 5,278,438 | 1/1994 | Kim et al. | 365/185 X |
| 5,282,160 | 1/1994 | Yamagata | 365/185 |
| 5,291,439 | 3/1994 | Kauffmann et al. | 365/185 |
| 5,469,383 | 11/1995 | McElroy et al. | 365/185.01 |

*Primary Examiner*—Do Hyun Yoo
*Attorney, Agent, or Firm*—Theodóre D. Lindgren; Robby T. Holland; Richard L. Donaldson

[57] ABSTRACT

An EPROM or flash EEPROM, which has an array of single-transistor, stacked-gate, memory cells. Active areas for transistor elements are in columns up and down the array, with columns being isolated by thick field oxide strips (220). Word lines (236) and source lines (212) run across the array. Bit lines (216) run along the active area columns to connect transistor drains (218). Bit lines are perpendicular to word lines. Each stacked gate includes a control gate (232) and a floating gate (230), with the latter having a top portion (230b) and a bottom portion (230a) that are separately deposited and etched. The bottom portion (230a) is etched in strips along the active area columns, and define the gate width of each cell. The top portion (230b) overlaps the bottom portion (230a) to improve capacitance between control gate (232) and floating gate (230).

10 Claims, 8 Drawing Sheets

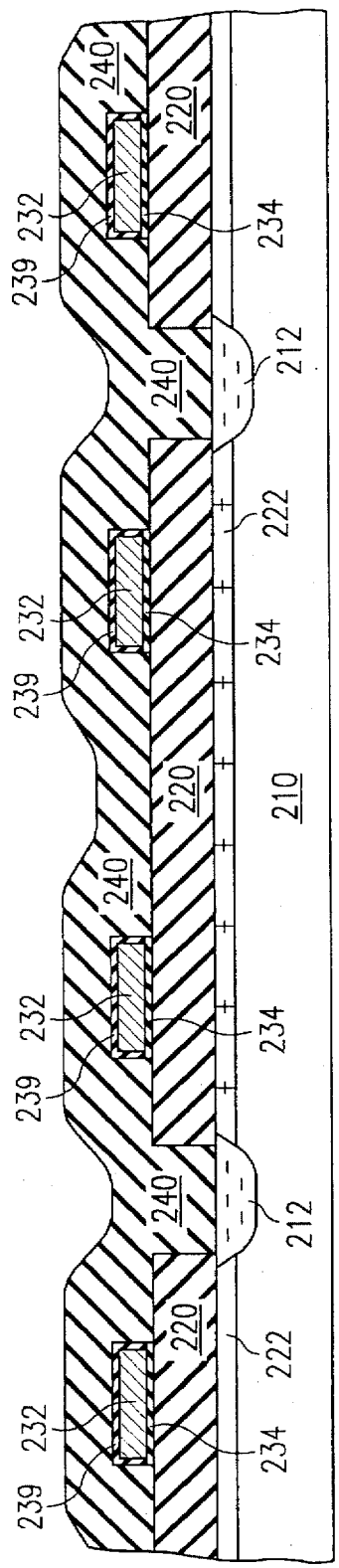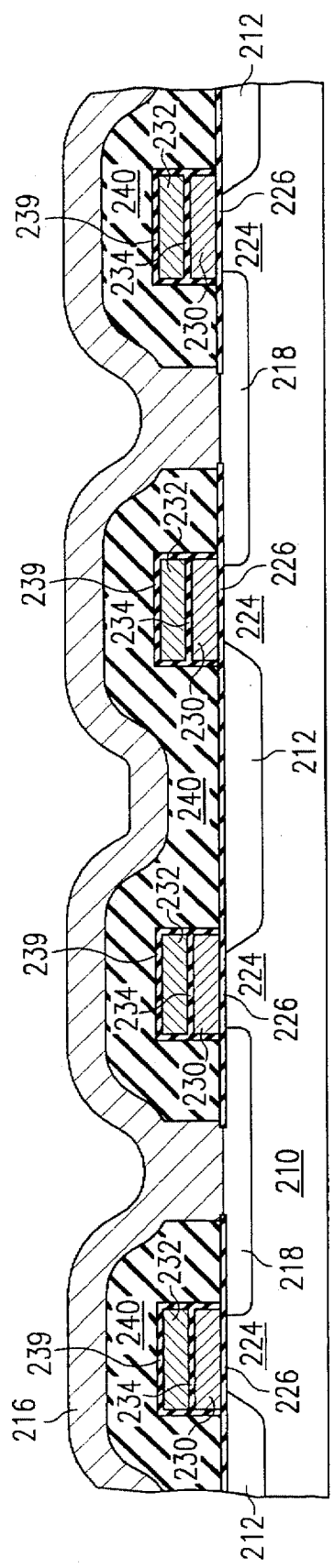

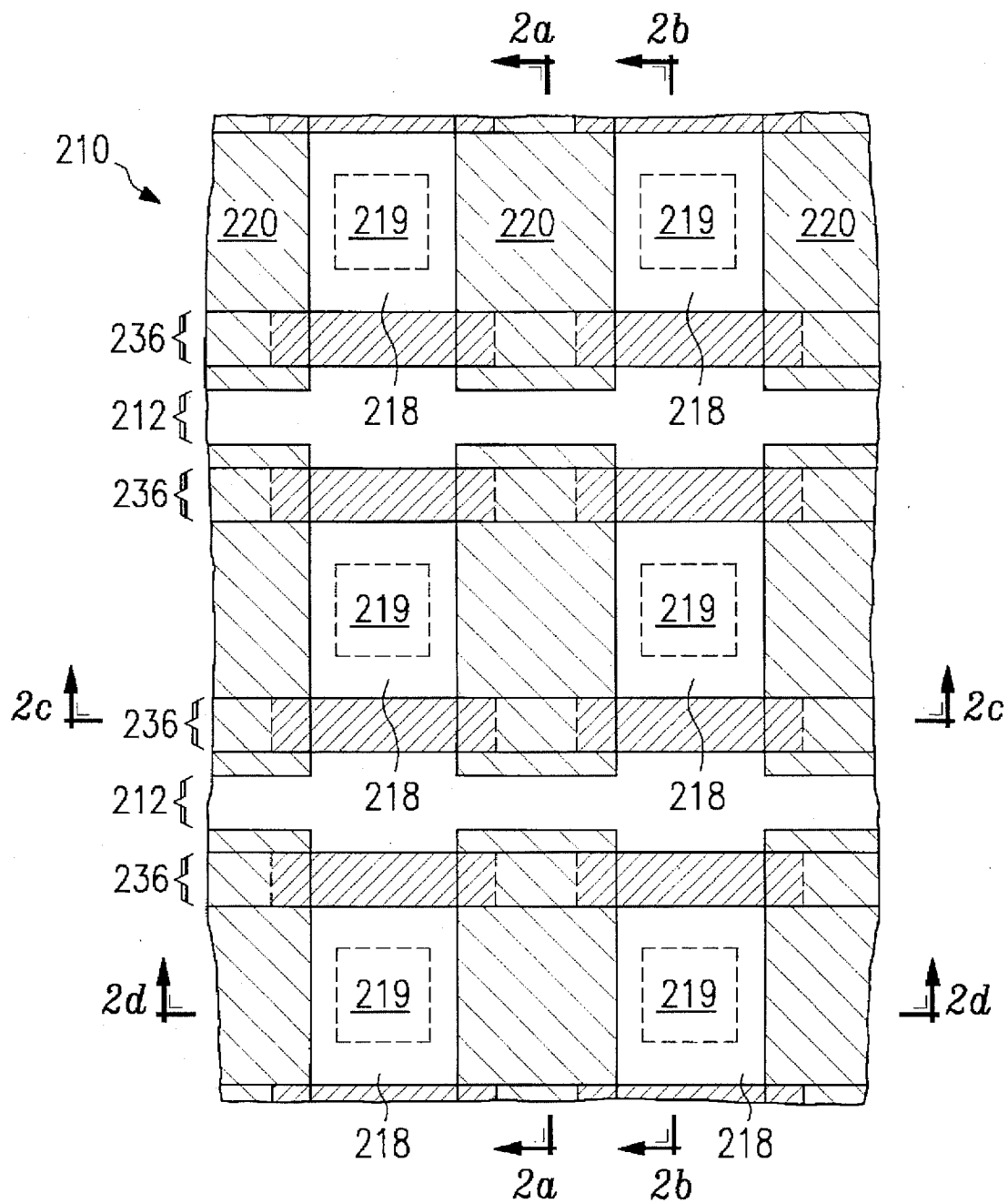

MEMORY CELL ARRAY WITH LOCOS FREE ISOLATION

This application is a continuation of application Ser. No. 08/364,528, filed Dec. 23, 1994, now abandoned which is a continuation of application Ser. No. 08/068,473, filed May 27, 1994, now abandoned.

TECHNICAL FIELD OF THE INVENTION

This invention relates to nonvolatile semiconductor memory devices, including electrically programmable, read-only memories (EPROMs) and flash EEPROMs and to methods for making them.

BACKGROUND OF THE INVENTION

EPROMs (erasable and programmable memories) are a type of CMOS transistor array. Most EPROMs being manufactured today have an array of memory cells and peripheral circuitry for addressing them.

The most common cell array design has single-transistor cells. The transistor has a double-poly gate structure, or "stacked-gate" structure, in which a control gate is formed from an upper polysilicon layer and a floating gate is formed from a lower polysilicon layer. Thick field oxide regions isolate adjacent cells. Flash-type EEPROMs, a type of electrically erasable PROM, have a similar structure.

FIG. 1 illustrates the field oxide regions of a portion of a conventional EPROM array. In conventional fabrication, a "moat mask" defines the active areas, including source lines that run parallel to rows of cells and connect transistor source regions. Row lines (word lines) and column lines (bit lines), although not shown in FIG. 1, run parallel to and perpendicular to the source lines, respectively. Each transistor shares a drain region with an adjacent transistor in the same column. The drains of transistors in a given column are contacted by the bit line. The source region is shared by a group of transistors common to a pair of adjacent word lines. The field oxide regions are grown by a localized field oxidation (LOCOS) process in areas not protected by the moat mask. They form a pattern of "islands", each designed as having a sideways "H" shape. Cells having this pattern of field isolation regions are sometimes referred to as "H cells".

The LOCOS process, known in the art, is typically preceded by formation of a nitride/pad oxide pattern, and a boron implant. The nitride/pad oxide pattern defines the active areas in which field oxide is not to be grown. It also acts as a mask to prevent the boron from penetrating the silicon in active areas. The boron implant creates channel stops in the field oxide regions. The thick oxide is grown over the channel stop region in areas not covered by the nitride.

A problem associated with LOCOS process is lateral oxidation that causes the oxide to grow under and lift the nitride edges. Because the shape of the oxide at the nitride edges is that of a tapering wedge that merges into the pad oxide, it has been named a "bird's beak". Thus, the bird's beak is a lateral extension of the field oxide into the active area of the device. The bird's beak formation inhibits scaling down of device size. Although the length of a bird's beak may vary with different fabrication processes, a typical length is about 0.5 micrometers for a field oxide thickness of 0.6 micrometers.

Another problem with LOCOS is that it inhibits scaling of bit line pitch because of the requirement of a moat (thin oxide region) overlap around the drain contact. To prevent shorting of metal bit lines to the substrate, a certain margin of thin oxide active area junction region must exist around all sides of the contact to the field oxide regions. However, the actual shape of the field oxidation regions, as depicted by the dotted lines of FIG. 1, encroaches on the active areas and reduces the size of the margin.

A third problem with LOCOS is that the oxide near the edges of the gate oxide areas, at the interface with LOCOS regions, is generally inferior to the oxide grown away from the LOCOS edge.

SUMMARY OF THE INVENTION

One aspect of the invention is a structure for a single-transistor cell for a memory cell array, such as an EPROM or flash EEPROM array, fabricated on a semiconductor substrate. Each memory cell has a floating gate, a control gate, a source, and a drain. Each floating gate has a bottom portion, formed from polysilicon strips, and a top portion that lies above a thick field oxide layer. A channel region (with thin oxide) is directly below the bottom portion of the floating gate. The field oxide is LOCOS free, and lies between and separates the bottom portions of floating gates of adjacent transistors. The thick field oxide isolates the active areas of adjacent columns of memory cell transistors.

For forming the floating gates, polysilicon strips are etched to form the bottom portions of the floating gates. A thick oxide is deposited everywhere, and an etch back process is used to expose the top surface of the polysilicon strips. This results in alternating strips of thick oxide and polysilicon. Then, the top portion of the floating gate is etched from a second polysilicon layer, to form strips that overlap the first polysilicon strips. The overlapping portion is on top of the thick oxide, which improves capacitive coupling between the control gate and the floating gate.

A technical advantage of the invention is that the above-described structure and fabrication avoid the use of LOCOS for field oxide, and hence the various problems that arise from LOCOS field isolation are minimized or eliminated. The result is an EPROM or flash EEPROM array that is more easily scalable down in size.

BRIEF DESCRIPTION OF THE DRAWINGS

FIGS. 2A–2D, are elevation views of a portion of a flash EEPROM, taken along lines 2a—2a, 2b—2b, 2c—2c and 2d—2d of FIG. 2E, which is a plan view of the same device.

DETAILED DESCRIPTION OF THE INVENTION

Figure 1:
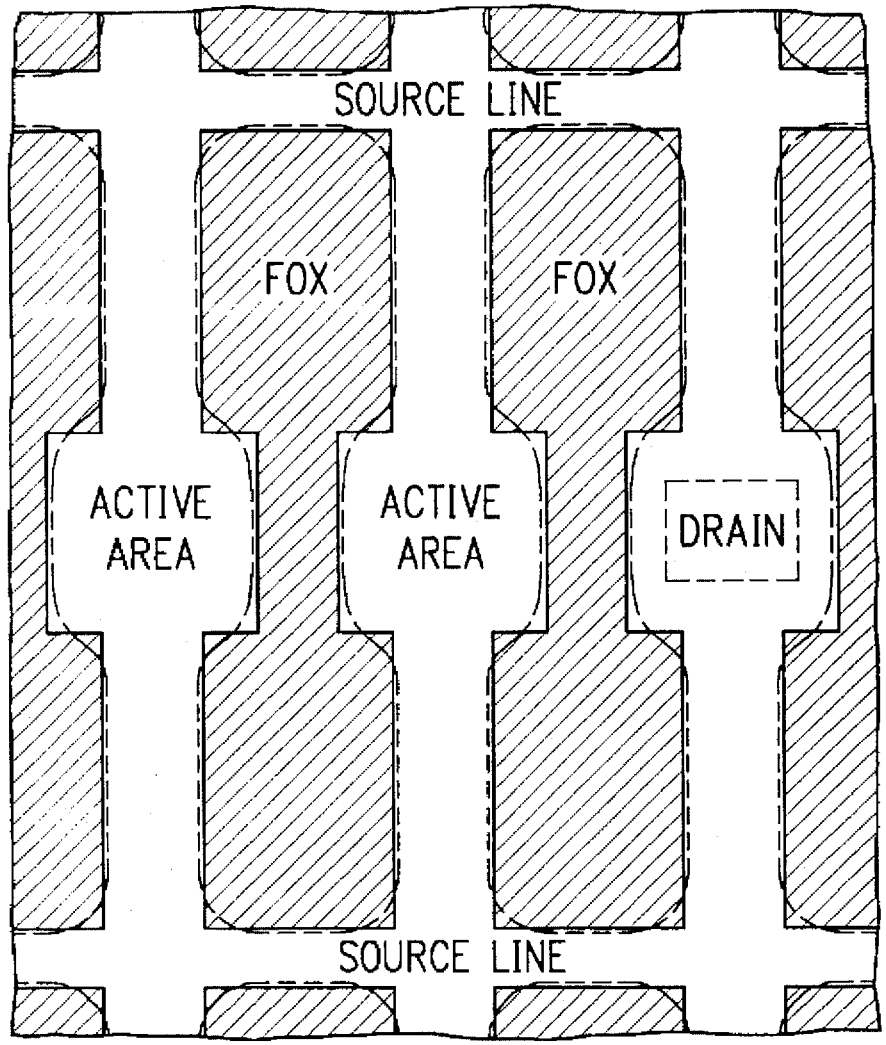
FIG. 1 illustrates the field oxide regions of a portion of a conventional EPROM or flash EEPROM array.

The description herein is in terms of a memory cell array for a flash EEPROM (electrically erasable and programmable memory). These memory devices have an array of single-transistor cells in an H-cell pattern, in which stacked gates are formed from polysilicon strips perpendicular to alternating active area moats and field isolation strips. However, the invention is not limited to flash EEPROM's; it could be applied to any memory cell array having similar characteristics. For example, EPROMs have a similar single-transistor, stacked gate, design. In general, the invention applies to FAMOS (floating gate, avalanche injection, MOS) cell designs.

FIGS. 2A–2E illustrate a portion of a finished flash EEPROM. FIGS. 2A–2D are elevation views, taken along lines 2a—2a, 2b—2b, 2c—2c and 2d—2d of FIG. 2E, which is a plan view of the same device. As will be explained below, some features of FIGS. 2A–2E are the same as those of existing flash EEPROM arrays. However, an important feature of the invention is that its floating gate has a bottom part and a top part, which are each formed in separate steps. The bottom part is made from polysilicon strips which alternate with thick oxide strips.

Referring to FIGS. 2A–2E, the memory cells are formed on the surface of a p-type silicon substrate 210. Source lines 212, which are n+ type, connect source regions 212 of the cells. Drain column lines 216 connect drain regions 218.

Cell-isolation thick field oxide regions 220 and channel stop regions 222 provide isolation between columns of cells. A channel region 224 (corresponding to the cell gate width, w) is between the source region 214 and drain region 218 of every cell. A gate oxide layer 226 separates the channel region 224 from floating gate 230.

Figure 2C:
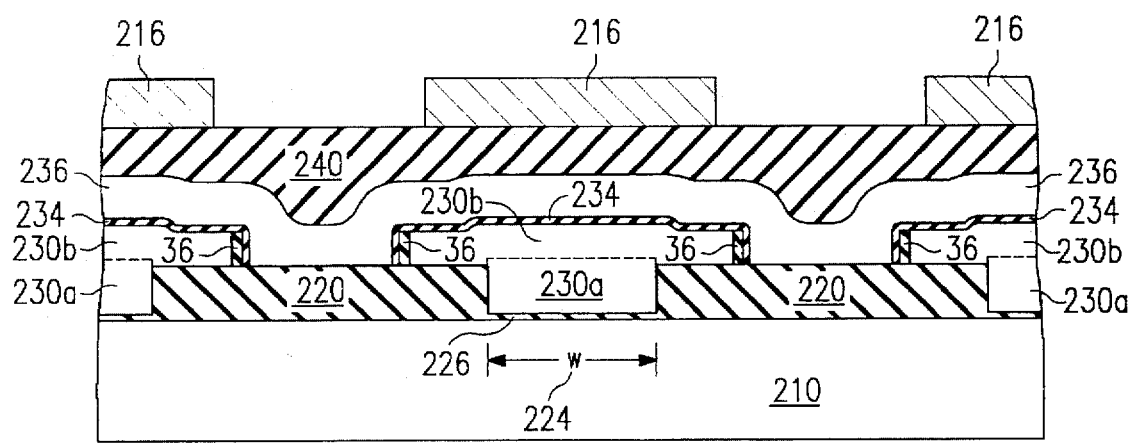

Floating gate 230 is insulated from control gate 232 by an inter-level dielectric layer 234. At each memory cell, a word line 236 becomes a control gate 232 above floating gate 230. The two-part structure of floating gate 230 is indicated in FIG. 2C, together with a sidewall 36, formed as explained below in connection with FIGS. 3A–3H.

An oxide layer 240 is deposited over the whole chip, including word lines 236, drain regions 218, and source regions 212, to isolate metal layer from poly-2 layer. Bit lines 216 connect drain regions 218.

As indicated by FIGS. 2B and 2E, source regions 212 and drain regions 218 are shared by pairs of column-wise adjacent cells. Each cell in a column has its own stacked gate structure, but shares a drain and a source with an adjacent cell. The source line running parallel to and between a pair of word lines, is shared by a group of cells common to the pair of word lines. A group of source lines are generally joined together (not shown).

FIGS. 3A–3H illustrate a process of fabricating an array of memory cells for an EPROM or a flash EEPROM. The fabrication of peripheral CMOS circuitry is not relevant to the invention and may be performed by conventional methods.

FIGS. 3A–3H correspond to FIG. 2C, such that the completed process will result in the structure of FIG. 2C. A feature of the invention, to be explained below, is that instead of being grown by a LOCOS process, the oxide for field isolation layer 220 is deposited. An extra polysilicon layer is used to form a bottom part of floating gates 230. As will be explained, this extra layer is etched to define the cell gate width across each column of cells to prevent thick oxide from being deposited in active areas.

Figure 3A:
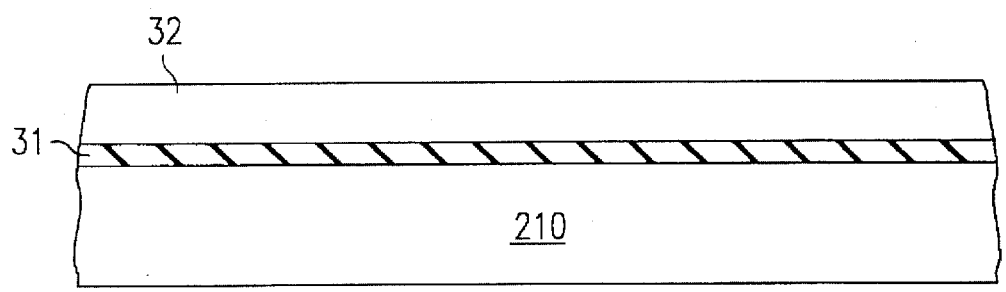
FIGS. 3A–3H, 3B', 3D', and 3F' illustrate a process of fabricating an EPROM or flash EEPROM in accordance with the invention.

As part of the fabrication process, several steps occur prior to the process shown in FIG. 3A. For example, a layers 32 and 35 of pad oxide is grown or deposited on substrate 210. A nitride layer is then deposited over the pad oxide by means of a chemical vapor deposition process. The pad oxide and silicon nitride layers are then patterned and etched to expose substrate 210 in areas where field oxide regions is needed for peripheral circuitry. After nitride etch, a boron implant into p+ channel stop areas is performed. The nitride/pad oxide resist stack masks those areas in which boron is not to be implanted. After the implant, resist is removed, followed by a clean-up, and a LOCOS process. The LOCOS process, discussed here, is not part of the invention. Next, a threshold adjust implant may be made. In general, fabrication steps needed for CMOS will not be discussed here. Also, the commonly known process steps, such as contact, metal and overcoat process will not be discussed in detail.

As regards the invention, in FIG. 3A, a thin oxide layer 31 has been grown everywhere over substrate 210 and a boron implant performed in the memory array area for adjusting the cell threshold voltage. Thin oxide layer 31 will form the gate oxide 226 of FIG. 2B. This is a "high quality" oxide layer. As explained below, during subsequent fabrication steps, a thick oxide is deposited rather than LOCOS-grown, which prevents the quality of the thin oxide from being compromised. For a flash EEPROM, a typical thickness of the oxide layer 31 is in the range of 80 to 120 angstroms. For EPROMs, a typical thickness would be in the range of 150 to 300 angstroms.

A first layer 32 of first-level polysilicon (poly 1A) is then deposited everywhere, over the thin oxide layer 31. Poly 1A layer 32 is then doped with an n+ dopant such as phosphorous by known methods, and deglazed.

Figure 3B:
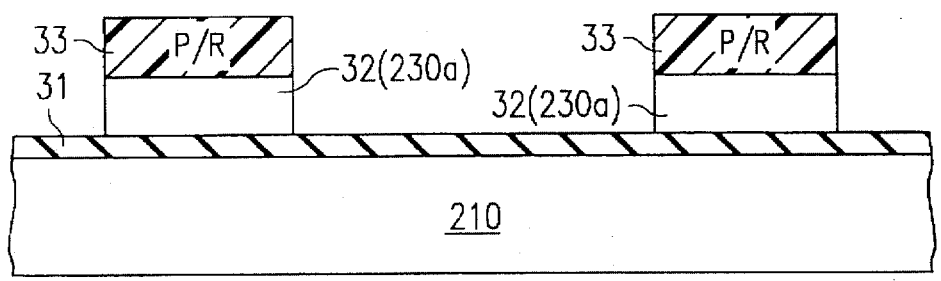
Figure 3B:
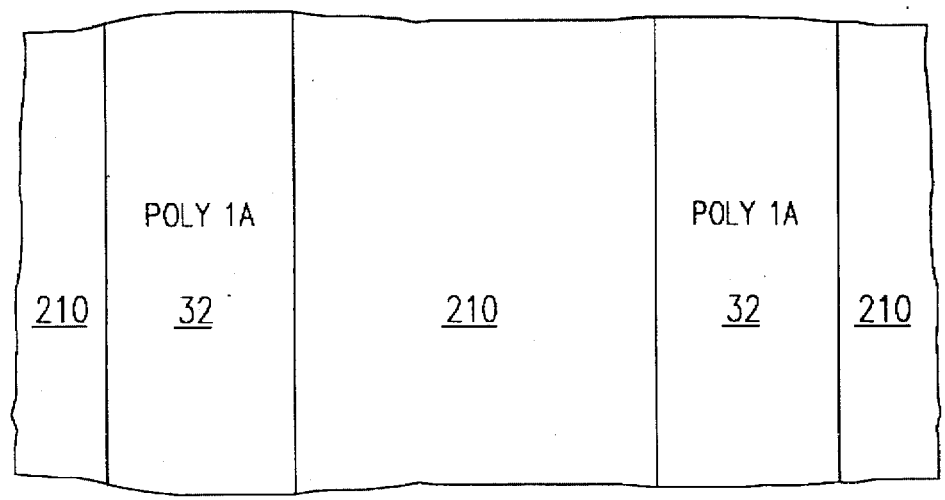

In FIG. 3B, a photoresist layer 33 has been deposited and patterned over the poly 1A layer 32. Using conventional photolithography techniques, a pattern of poly 1A strips 32 has been defined and etched. These strips 32 will become the bottom part 230a of floating gate 230, which defines the cell gate width, w, in FIG. 2C. FIG. 3B' is a plan view of the poly 1A strips 32.

Figure 3C:
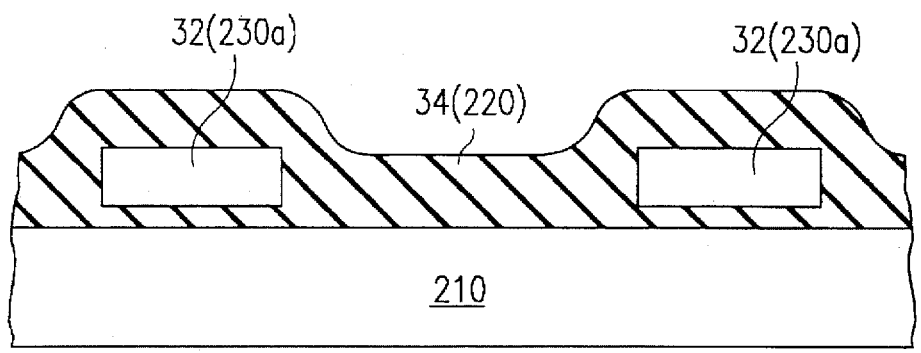

In FIG. 3C, photoresist 33 has been removed and a clean-up performed. A thick oxide layer 34 has been deposited everywhere, including over poly 1A strips 32. This thick oxide layer 34 will become field isolation regions 220.

Figure 3D:
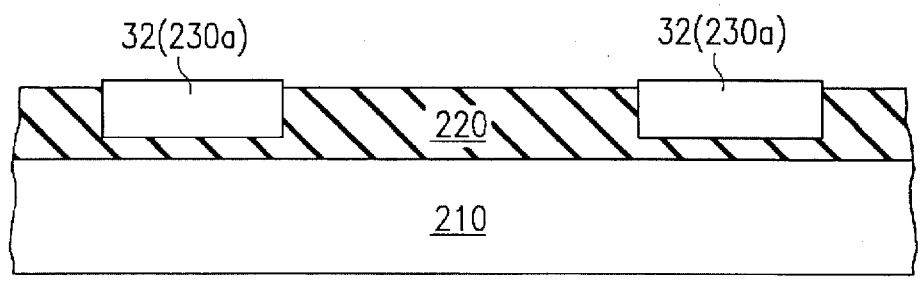
Figure 3D:
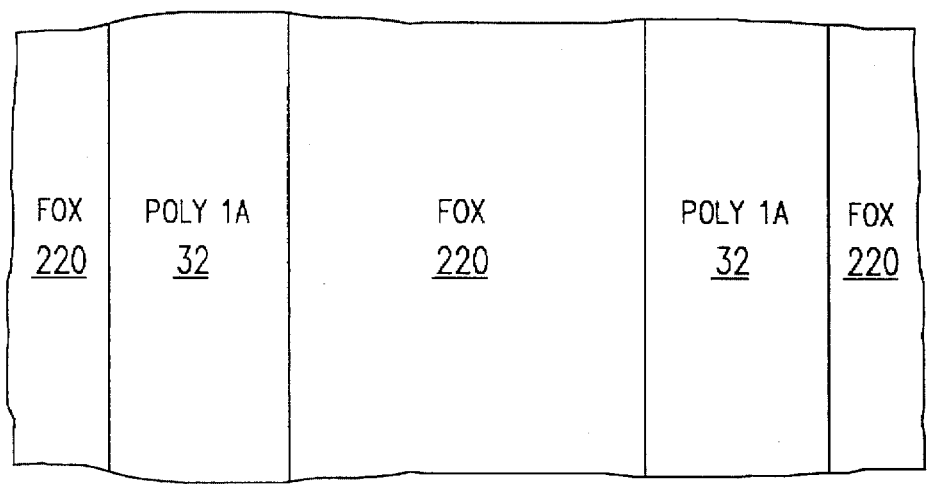

In FIG. 3D, a resist etch-back process, known in the art, has been performed to remove a top portion of the deposited oxide layer 34, such that the top surfaces of the poly 1A strips 32 are exposed. FIG. 3D' is a top plan view of the alternating field isolation regions 220 and poly 1A strips 32 that result from the resist-etch back. A clean-up of any residue from the resist-etch back is then performed.

Figure 3E:
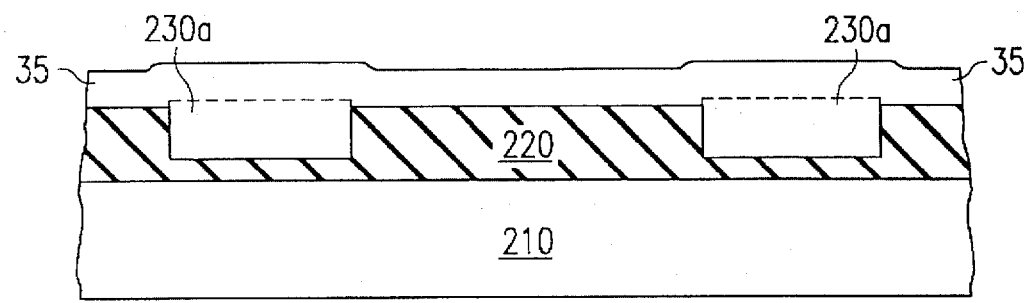

In FIG. 3E, a second layer 35 of first-level polysilicon (poly 1B) is deposited everywhere. This poly 1B layer 35 is also doped n+.

Figure 3F:
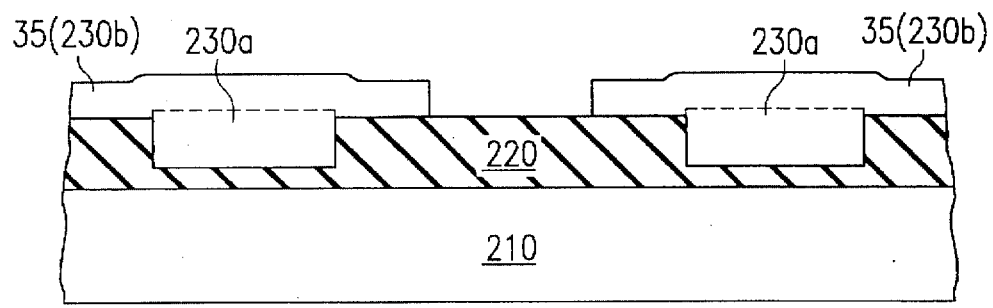
Figure 3F:
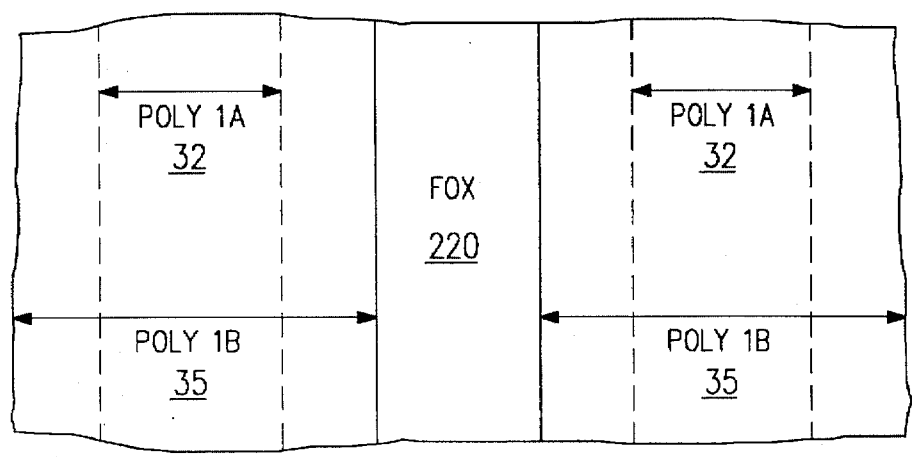

In FIG. 3F, poly 1B layer 35 has been patterned and etched, using a photoresist layer (not shown) and conventional photolithography techniques, to form a pattern of poly 1B strips 35. Poly 1B strips 35 will eventually form the top part 230b of the floating gates 230 of FIGS. 2B and 2C. After the etch, a boron channel stop implant [a dose in the range of 5E12 to 9E12 cm$^{-2}$ at 20–50 KEV] is performed and the photoresist is removed and a clean-up is performed. This channel stop implant isolates the adjacent cells shown in FIG. 2C. The channel stop implant can also be performed after etching the poly 1A strips in the process of FIG. 3B.

After being etched, each poly 1B strip 35 covers an underlying poly 1A area 32. Ideally, each poly 1B strip 35 extends past both column-wise edges of its poly 1A strip 32, which will provide extra capacitance between the control gate 232 and floating gate 230 of FIG. 2B and 2C. FIG. 3F' is a top plan view of the alternating field isolation regions 220 and poly 1B strips 35, which lie over poly 1A strips 32.

Figure 3G:
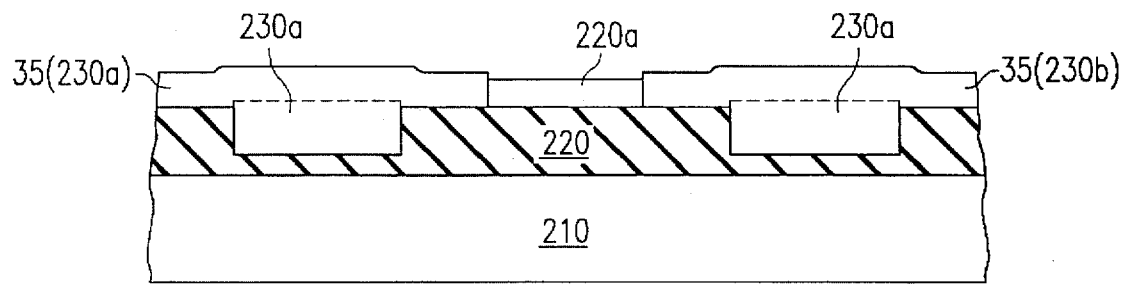

FIG. 3G illustrates an optional oxide deposition step, followed by a resist etch-back step, similar to the steps of FIGS. 3C and 3D. This provides an additional planar topology 220a above oxide layer 220 between the poly 1B strips 35.

Figure 3H:
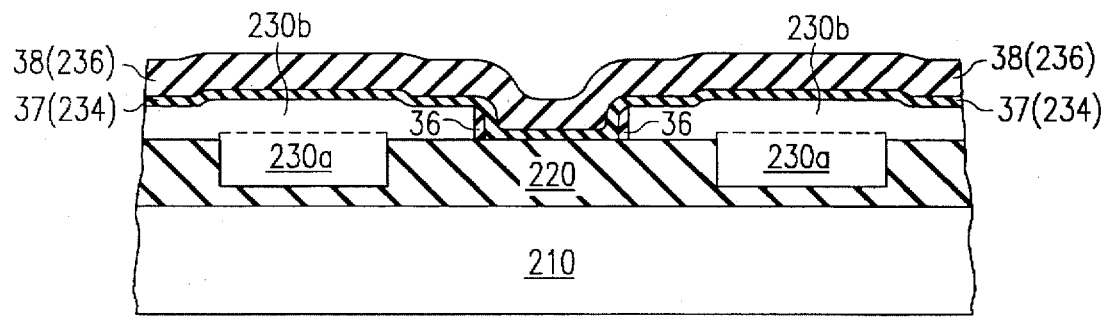

FIG. 3H assumes that the optional step of FIG. 3G was not performed. In the process of FIG. 3H, edges of the poly 1B strips 35 are covered with a sidewall oxide coating 36. This is accomplished by conventional means, such as by deposition of a layer of oxide and an anisotropic etch. Alternatively, another thin oxide layer (not shown) could be formed over poly 1B strips 35. During this oxidation, the edges of poly 1B strips 35 also are oxidized, acting as sidewall oxide. There are a number of processes that permit formation of this poly-edge oxide.

An insulating layer 37 is then deposited. Typically, insulating layer 37 is comprised of oxide-nitride-oxide (ONO) layers having a collective thickness in the range of 150 to 300 angstroms of oxide thickness equivalent. Insulating layer 37 corresponds to layer 234 of FIGS. 2B and 2C.

Finally, a second-level polysilicon (poly 2) layer 38 is deposited everywhere, doped with an n+ dopant, and deglazed. Poly 2 layer 38 will form the word lines 236, which include control gates 232, of FIGS. 2A and 2B.

For formation of the floating gates 230 and word lines 236 of FIGS. 2A and 2B, a stack etch is performed. Photoresist (not shown) is applied to define row-wise strips, which each include a portion of the poly 2 layer 38, the inter-level insulator layer 37, and the poly 1A and poly 1B layer 32. The result of the stack etch is an etch of poly 2 (strips 38), insulating layer 37 (234), poly 1A (strips 32), and poly 1B (strips 35), to form the stacked-gate structure. Each control gate 232 is capacitively coupled to its associated floating gate 230 through an interlevel insulator 234.

A source line mask process is used to etch exposed field oxide, resulting in source lines 212, followed by resist removal and clean-up.

A variation of the source line definition and etch process is where, after stack etch described above, the drain regions 218 and the field oxide 220 between the drain regions are covered by photoresist, and an etch process etches the exposed field oxide self aligned to the stack edge. This results in source line of essentially uniform width (not shown).

After the source line etch process, a self-aligned source/drain implant is performed, using stack edges as the self-aligning edges with a conventional photoresist process. This implant process implants both the source region 212 and the drain region 218. Next the resist is removed and a clean up performed.

Using another photomasking step, source-only region is exposed to an n-type implant to provide graded source junction for flash EEPROM. Then the resist is removed, and a clean up is performed. Next, an oxidation step is performed to grow good quality oxide 239 on the exposed edges of poly 2, poly 1B, and poly 1A for improved data retention.

Figure 2D:
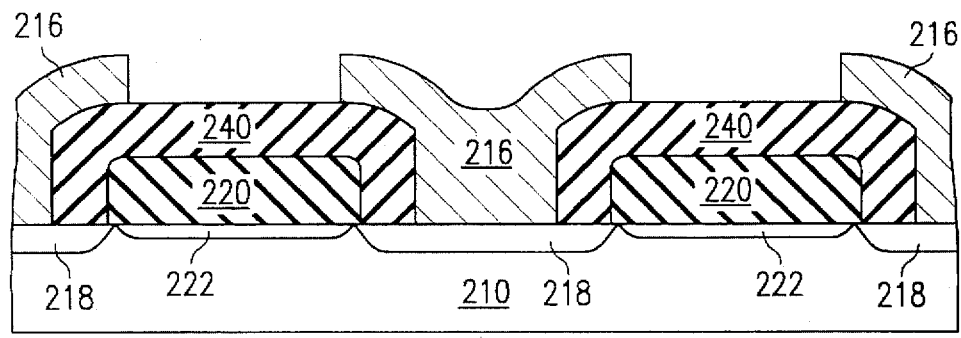

The oxide layer 240 of FIGS. 2A–2D is then formed everywhere by conventional means, followed by contact and metal processes resulting in the bit lines 216 of FIG. 2D connecting drain regions 218 via contact 219. Though not an intrinsic part of the invention, a self-aligned contact process can be used to reduce the cell size. The bit lines 216 run over and perpendicular to word lines 236 and source lines 212. This is followed by protective overcoat (not shown) process.

Other Embodiments

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A method for forming an array of memory cells in rows and columns on a semiconductor substrate, each said memory cell formed in an active area of said semiconductor substrate, each said memory cell including a floating gate having a lower polysilicon layer and an upper polysilicon layer separately deposited on said lower polysilicon layer, said method comprising:

forming thick field oxide strips between said active areas of each said column of memory cells;

each said lower polysilicon layer of each said floating gate formed between said thick field oxide strips, and each said upper polysilicon layer of each said floating gate formed above said thick field oxide strips;

forming word lines insulated from said upper polysilicon layer of each said floating gate in rows of said memory cells; and each said memory cell including a source in said active area, said method further including forming source lines in said active areas connecting said sources in rows of said cells, said source lines parallel to said word lines.

2. The method of claim 1, wherein said thick field oxide strips are formed from a layer of thick oxide on said semiconductor substrate and later forming said lower polysilicon layer of each said floating gate on polysilicon strips, said thick field oxide strips formed by etching back said layer of thick oxide to expose the top surface of said polysilicon strips.

3. The method of claim 1, wherein said upper polysilicon layer of each said floating gate extends over said substrate farther than said lower polysilicon layer of each said floating gate.

4. The method of claim 1, further comprising forming a sidewall oxide adjacent at least one edge of said upper polysilicon layer of each said floating gate.

5. The method of claim 1, further comprising forming a thin oxide layer between said thick field oxide strips and said semiconductor substrate, and further comprising forming said thin oxide layer between said lower polysilicon layer of said floating gate and said semiconductor substrate.

6. The method of claim 2, wherein said upper polysilicon layer of each said floating gate is formed by depositing a layer of polysilicon on said polysilicon strips and on said thick field oxide strips, then performing a stack etch at least through said layer of polysilicon.

7. The method of claim 1, wherein each said memory cell includes a drain formed in said active area, and said method further comprising forming bit lines connecting said drains in columns of said cells.

8. The method of claim 1, wherein said lower polysilicon layer of each said floating gate is formed to define a gate width for each said memory cell.

9. A method for forming an array of memory cells in rows and columns on a semiconductor substrate, each said memory cell formed in an active area of said semiconductor substrate, each said memory cell including a floating gate having a lower polysilicon layer and an upper polysilicon layer separately deposited on said lower polysilicon layer, said method comprising:

forming thick field oxide strips between said active areas of each said column of memory cells, said thick field oxide strips formed by depositing and etching a first polysilicon layer to form level-one polysilicon strips, then depositing a thick oxide layer and etching said thick oxide layer to form alternating strips of said thick field oxide strips between said level-one polysilicon strips; and forming said memory cells in said active areas, each said memory cell having said floating gate, a control gate, a source, and a drain, wherein forming each said floating gate includes depositing a second polysilicon layer over said level-one polysilicon strips and said thick field oxide strips, then etching said second polysilicon layer to form level-two polysilicon strips having a lateral dimension greater than the lateral dimension of said level-one polysilicon strips.

10. The method of claim 9, wherein each said control gate is formed by depositing a third polysilicon layer over at least said level-two polysilicon strips and etching said third polysilicon layer to define said control gates.

* * * * *